United States Patent
Parkhideh et al.

(10) Patent No.: US 10,782,323 B2
(45) Date of Patent: Sep. 22, 2020

(54) WIDEBAND CONTACTLESS MAGNETORESISTIVE-ROGOWSKI CURRENT SENSING

(71) Applicant: University of North Carolina Charlotte, Charlotte, NC (US)

(72) Inventors: Babak Parkhideh, Charlotte, NC (US); Shahriar Jalal Nibir, Charlotte, NC (US)

(73) Assignee: University of North Carolina Charlotte, Charlotte, NC (US)

( * ) Notice: Subject to any disclaimer, the term of this patent is extended or adjusted under 35 U.S.C. 154(b) by 0 days.

(21) Appl. No.: 16/073,542

(22) PCT Filed: May 12, 2017

(86) PCT No.: PCT/US2017/032415
§ 371 (c)(1),
(2) Date: Jul. 27, 2018

(87) PCT Pub. No.: WO2017/197269
PCT Pub. Date: Nov. 16, 2017

(65) Prior Publication Data
US 2019/0064225 A1 Feb. 28, 2019

Related U.S. Application Data

(60) Provisional application No. 62/336,152, filed on May 13, 2016, provisional application No. 62/349,899, filed on Jun. 14, 2016.

(51) Int. Cl.
G01R 15/20 (2006.01)
G01R 15/18 (2006.01)
G01R 19/00 (2006.01)

(52) U.S. Cl.
CPC ......... G01R 15/205 (2013.01); G01R 15/181 (2013.01); G01R 19/0092 (2013.01)

(58) Field of Classification Search
CPC ............. G01R 15/205; G01R 19/0092; G01R 15/181; G01R 1/0441; G01R 31/088; G01R 35/005
See application file for complete search history.

(56) References Cited

U.S. PATENT DOCUMENTS 5,420,781 A 5/1995 Schmidt
5,502,379 A * 3/1996 Hansel ................. B66C 13/063
324/207.14

(Continued)

FOREIGN PATENT DOCUMENTS

WO 2016/210287 A1 12/2016

OTHER PUBLICATIONS

International Search Report for PCT/US2017/032415 dated Aug. 14, 2017.

(Continued)

*Primary Examiner* — Christopher P McAndrew
*Assistant Examiner* — Zannatul Ferdous
(74) *Attorney, Agent, or Firm* — Thomas Horstemeyer, LLP

(57) ABSTRACT

Various examples are provided for contactless wideband current sensing. A combination of magnetoresistive (MR) sensor and Rogowski coil outputs can be combined to provide current sensing from DC to 10 MHZ or more. In one example, a system includes a MR sensor that can provide an MR output voltage corresponding to a magnitude of the current through a trace; a Rogowski coil sensor that can provide a Rogowski output voltage corresponding to a magnitude of the current; and processing circuitry configured to generate an output current signal by aggregating the (Continued)

MR and Rogowski output voltages. In another example, a method includes conditioning an output from a MR sensor disposed adjacent to a trace carrying a current; conditioning an output from a Rogowski coil disposed adjacent to the trace; and aggregating the first and second conditioned signals to provide an output current signal corresponding to the current passing through the trace.

20 Claims, 10 Drawing Sheets

(56) References Cited

U.S. PATENT DOCUMENTS

| | | | | |
|---|---|---|---|---|
| 5,708,407 | A * | 1/1998 | Mouchot | B82Y 25/00 257/E43.004 |
| 6,313,623 | B1 * | 11/2001 | Kojovic | G01R 15/181 324/127 |
| 6,366,076 | B1 * | 4/2002 | Karrer | G01R 15/181 324/117 R |
| 6,954,774 | B1 * | 10/2005 | Mulbrook | H03H 7/0161 708/819 |
| 2005/0156599 | A1 | 7/2005 | Panzer | |
| 2007/0279042 | A1 * | 12/2007 | Tan | G01R 15/181 324/142 |
| 2010/0219887 | A1 * | 9/2010 | Ichitsubo | H03G 3/3036 330/124 R |
| 2011/0121828 | A1 * | 5/2011 | Gati | B82Y 25/00 324/252 |
| 2012/0212288 | A1 * | 8/2012 | Masui | H03H 11/0427 327/557 |
| 2014/0159717 | A1 | 6/2014 | Paci et al. | |
| 2015/0279623 | A1 * | 10/2015 | Liang | H01J 37/32091 156/345.34 |
| 2016/0011249 | A1 * | 1/2016 | Miller, III | H02H 1/0015 702/58 |
| 2016/0139199 | A1 * | 5/2016 | Petrie | G01D 5/2449 324/750.3 |
| 2016/0169940 | A1 * | 6/2016 | Ausserlechner | G01R 15/202 324/260 |

OTHER PUBLICATIONS

H. P. Forghani-zadeh and G. A. Rincon-Mora, "An accurate, continuous, and lossless self-learning CMOS current-sensing scheme for inductor-based DC-DC converters," IEEE J Solid-St. Circ., vol. 42, No. 3, Mar. 2007.

S. Ziegler, R. Woodward, H. H. Iu, and L. J. Borle, "Current sensing techniques: A review," IEEE Sensors J, vol. 9, No. 4, Apr. 2009.

A Patel and M. Ferdowsi, "Current sensing for automotive electronics—A survey,"IEEE Trans. on Vehic. Techno., vol. 58, No. 8, Oct. 2009.

Asahi Kasei Micro-devices (AKM). CQ-3303 High-Speed Response 289 Careless Current Sens. Datasheet, 2015. [Online]. Available: http:// 290www.akm.com/akm/en/file/datasheet/CQ-3303 .pdf 291, Jul. 2015.

J. Han, J. Hu, Y. Ouyang, S. X. Wang and J. He, "Hysteric modeling of output characteristics of giant magnetoresistive current sensors", IEEE Trans. on Ind Electron., vol. 62, No. 1, Jan. 2015.

F. Xie, R. Weiss and R. Weigel, "Hysteresis compensation based on controlled current pulses for magnetoresistive sensors," IEEE Trans. on Ind Electron., vol. 62, No. 12, Dec. 2015.

Sensitec GMBH, GF705 Magneto-Resistive Magnetic Field Sensor. Datasheet, 2015. [Online]. Available: http :1 /www.sensi tee. com/ upload/SENSITEC/PDF Downloads/Datenblatt/Sensi tee_ GF705 _DSE_09.pdf.

L. Dalessandro, N. Karrer, and J. W. Kolar, "High-performance planar isolated current sensor for power electronics applications," IEEE Trans. on Power Electro. vol. 22, No. 5, Sep. 2007.

Honeywell (MN). 1- and 2-Axis Magn. Sens. IDviC 100 III 002/1021/1022, Datasheet, 2008. [Online]. Available: http://www51. honeywell.com/ aero/common/documents/myaerospacecatalog-documents/Missiles-Munitions/HMC_1001-1002-1021-1022_Data_ Sheet.pdf.

Y. Xue, J. Lu, Z. Wang, L M. Tolbert, B. J. Blalock, and F. Wang, "A compact planar Rogowski coil sensor for active current balancing of parallel-connected Silicon Carbide MOSFETs," in Proc IEEE Energy Conversion Congress and Exposition (ECCE), Sep. 2014.

L. Zhao, J. D van Wyk, and W. G. Odendaal, "Planar embedded pick-up coil sensor for power electronic modules," in Proc. IEEE Applied Power Electronics Conference and Exposition (APEC), Feb. 2004.

P. E. Schneider, M. Horio, and R. D. Lorenz, "Integrating GMR field detectors for high-bandwidth current sensing in power electronic modules", IEEE Trans. on Industry Applications, vol. 48, No. 4, Jul./Aug. 2012.

P. E. Schneider, and R. D. Lorenz, "Evaluation of point field sensing in IGBT modules for high-bandwidth current measurement," IEEE Trans. on Ind. App., vol. 49, No. 3, May/Jun. 2013.

J. Jiang and K. Makinwa, "A hybrid multipath CMOS magnetic sensor with 210µTrms resolution and 3MHz bandwidth for contactless current sensing," IEEE Inter. Solid-State Circuits Conference, Jan. 2016.

S. Yuvarajan and L. Wang, "Performance analysis and signal processing in a current sensing current MOSFET (SENSEFET)," in Proc. IEEE Ind. App. Soci. Annu. Meet., vol. 2, pp. 1445-1450, Sep. 1991.

E. Dallago, M. Passoni, and G. Sassone, "Lossless current sensing in low-voltage high-current DC/DC modular supplies," IEEE Trans. on Ind. Electron., vol. 47, No. 6, pp. 1249-1252, Dec. 2000.

A. Simon-Muela, S. Petibon, C. Alonso, and J. Chaptal, "Practical implementation of a high-frequency current-sense technique for VRM," IEEE Trans. on Ind. Electron., vol. 55, No. 9, pp. 3221-3230, Sep. 2008.

R. Singh and A. M. Khambadkone, "Giant Magneto Resistive (GMR) effect based current sensing technique for low voltage/high current voltage regulator modules", IEEE Trans. on Power Electro., vol. 23, No. 2, pp. 915-925, Mar. 2008.

S. J. Nibir, E. Hurwitz, M. Karami, and B. Parkhideh, "A technique to enhance the frequency bandwidth of contactless magnetoresistive current sensors" IEEE Trans. on Ind. Electron., vol. 63, No. 9, pp. 5682-5686, Sep. 2016.

* cited by examiner

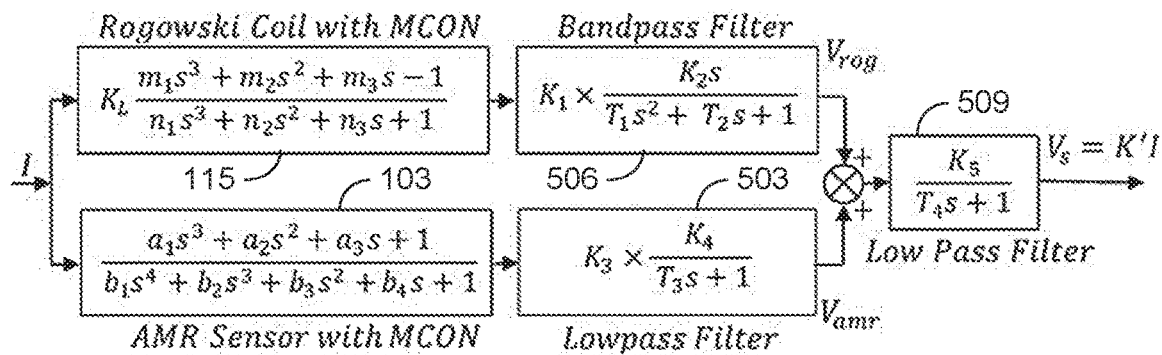

FIG. 6

| | | | |
|---|---|---|---|
| Modeling of the Sensing Elements | Magneto-Resistor Element with the Magnetic Concentrator | $a_1$ | $2.39 * 10^{-19}$ |
| | | $a_2$ | $9.58 * 10^{-13}$ |
| | | $a_3$ | $2.79 * 10^{-6}$ |
| | | $b_1$ | $2.47 * 10^{-27}$ |
| | | $b_2$ | $3.65 * 10^{-19}$ |
| | | $b_3$ | $1.06 * 10^{-12}$ |
| | | $b_4$ | $3.61 * 10^{-6}$ |
| | Planar Rogowski Element with the Magnetic Concentrator | $m_1$ | $5.98 * 10^{-21}$ |
| | | $m_2$ | $1.67 * 10^{-13}$ |
| | | $m_3$ | $2.62 * 10^{-5}$ |
| | | $n_1$ | $6.35 * 10^{-23}$ |
| | | $n_2$ | $6.02 * 10^{-16}$ |
| | | $n_3$ | $4.01 * 10^{-7}$ |
| | | $K_L$ | $7.17 * 10^{-4}$ |
| Conditioning Circuit Implementation | Magneto-Resistor Conditioning | $K_3$ | 1 |
| | | $K_4$ | 1 |
| | | $T_3$ | $1.59 * 10^{-8}$ |
| | Rogowski Conditioning | $K_1$ | 0.3 |
| | | $K_2$ | $7.16 * 10^{-8}$ |
| | | $T_1$ | $6.33 * 10^{-16}$ |
| | | $T_2$ | $7.16 * 10^{-8}$ |
| | Output Conditioning | $K_5$ | 1 |
| | | $T_4$ | $1.59 * 10^{-8}$ |

FIG. 7

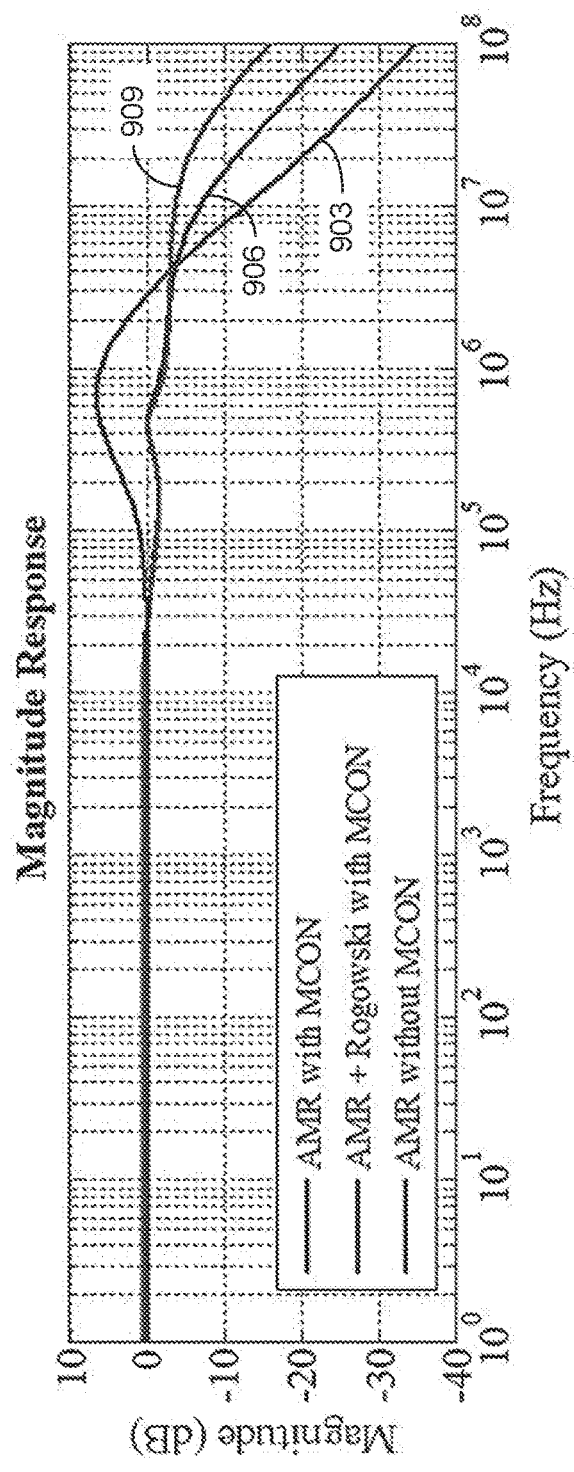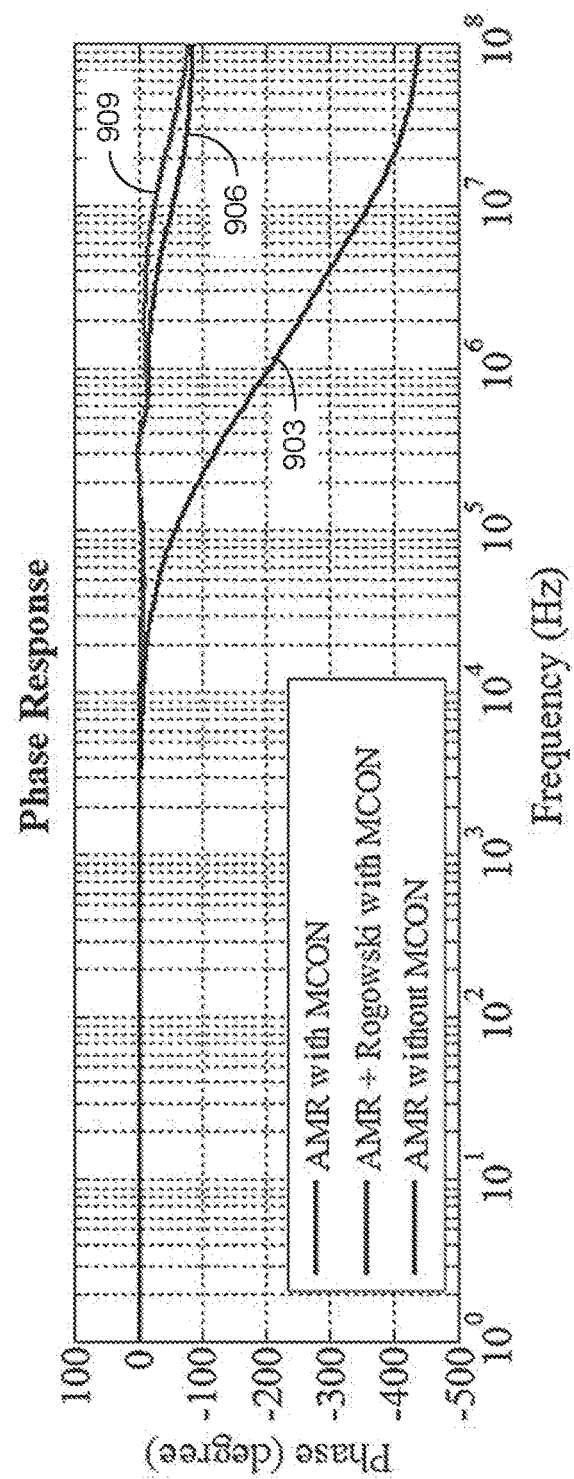

WIDEBAND CONTACTLESS MAGNETORESISTIVE-ROGOWSKI CURRENT SENSING

CROSS REFERENCE TO RELATED APPLICATIONS

This application is the 35 U.S.C. § 371 national stage application of PCT Application No. PCT/US2017/032415, filed May 12, 2017, which claims priority to, and the benefit of, U.S. provisional applications entitled "Magnetoresistor-Rogowski Wideband Contactless Current Sensing Scheme" having Ser. No. 62/336,152, filed May 13, 2016, and Ser. No. 62/349,899, filed Jun. 14, 2016, all three of which are hereby incorporated by reference in their entireties.

STATEMENT REGARDING FEDERALLY SPONSORED RESEARCH OR DEVELOPMENT

This invention was made with government support under agreement 1610250 awarded by the National Science Foundation (NSF). The Government has certain rights to the invention.

BACKGROUND

Current information is the single most essential parameter to be known for most control, diagnostic and prognostic purposes. Different integrated and lossless current sensing methods, such as series MOSFET's on-resistance and parallel current-sensing FET (sense-FET) have been proposed to deduce the switch or inductor current information. However, these approaches do not provide electric isolation and are limited to low voltage applications of less than 30V.

SUMMARY

Aspects of the present disclosure are related to contactless wideband current sensing. Magnetoresistive (MR) sensor and Rogowski coil outputs can be combined to provide current sensing at high frequencies above 3 MHz.

In one aspect, among others, a wideband contactless current sensing system comprises a magnetoresistive (MR) sensor disposed adjacent to a trace configured to carry current; a Rogowski coil sensor disposed adjacent to the trace; and processing circuitry configured to generate an output current signal by aggregating MR and Rogowski output voltages. The MR sensor can be configured to provide an MR output voltage corresponding to a magnitude of the current at frequencies from DC to at least a MHz cutoff frequency, the Rogowski coil sensor can be configured to provide a Rogowski output voltage corresponding to the magnitude of the current at frequencies from at least the MHz cutoff frequency to at least 10 MHz, and the output current signal can correspond to the magnitude of the current passing through the trace at a frequency in a range from DC to at least 10 MHz. In one or more aspects, the processing circuitry can be configured to condition the MR output and the Rogowski output prior to aggregating. Conditioning of the MR output can comprise low pass filtering prior to aggregation with the Rogowski output. Conditioning of the Rogowski output can comprise bandpass filtering prior to aggregation with the MR output. The bandpass filtering can have a range from about 2 MHz to about 20 MHz, or other appropriate range as can be determined.

In one or more aspects, the output current signal can be low pass filtered by the processing circuitry after aggregation of the MR and Rogowski outputs. The processing circuitry can comprise digital processing circuitry including analog-to-digital converters (ADCs) configured to sample the MR and Rogowski outputs. The processing circuitry can comprise an amplifier coupled between an output connection of the MR sensor and the ADC configured to sample the MR output. The Rogowski coil can be embedded in a printed circuit board (PCB) adjacent to the trace. In various aspects, a magnetic concentrator (MCON) can be disposed over the Rogowski coil. The MR sensor can be an anisotropic magnetoresistor (AMR) sensor mounted over the trace with a magnetic concentrator (MCON) is disposed over the AMR sensor.

In another aspect, a method for wideband contactless current sensing comprises generating a first conditioned signal by conditioning an output from a magnetoresistive (MR) sensor disposed adjacent to a trace carrying a current, the output from the MR sensor corresponding to a magnitude of the current; generating a second conditioned signal by conditioning an output from a Rogowski coil disposed adjacent to the trace, the output from the Rogowski coil corresponding to the magnitude of the current; and aggregating the first and second conditioned signals to provide an output current signal corresponding to the current passing through the trace, where the output current signal corresponding to a fixed current magnitude is substantially constant over a frequency range from DC to at least 10 MHz. The first conditioned signal can be generated by low pass filtering the output from the MR sensor. The method can comprise amplifying the output from the MR sensor prior to conditioning. The output from the MR sensor can be amplified by a differential operational amplifier. The second conditioned signal can be generated by bandpass filtering the output from the Rogowski coil. The bandpass filter can be a second order bandpass filter. In various aspects, the output of the MR sensor can be adjusted by a first gain factor and the output of the Rogowski coil is adjusted by a second gain factor. A magnetic concentrator (MCON) can be disposed over the Rogowski coil. The MR sensor can be an anisotropic magnetoresistor (AMR) sensor having a magnetic concentrator (MCON) positioned over the AMR sensor opposite the trace.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 6 is a block diagram illustrating an example of the operation principle of the wideband MRR current sensing system of FIGS. 4A and 4B, in accordance with various embodiments of the present disclosure.

FIG. 7 is a table that provides system parameters of FIG. 6 determined from prototype testing of the AMR sensor and Rogowski coil with the folded trace MCON technique, in accordance with various embodiments of the present disclosure.

FIGS. 9A and 9B present frequency analysis plots of the wideband MRR current sensing system of FIGS. 4A and 4B, in accordance with various embodiments of the present disclosure.

DETAILED DESCRIPTION

Figure 1:
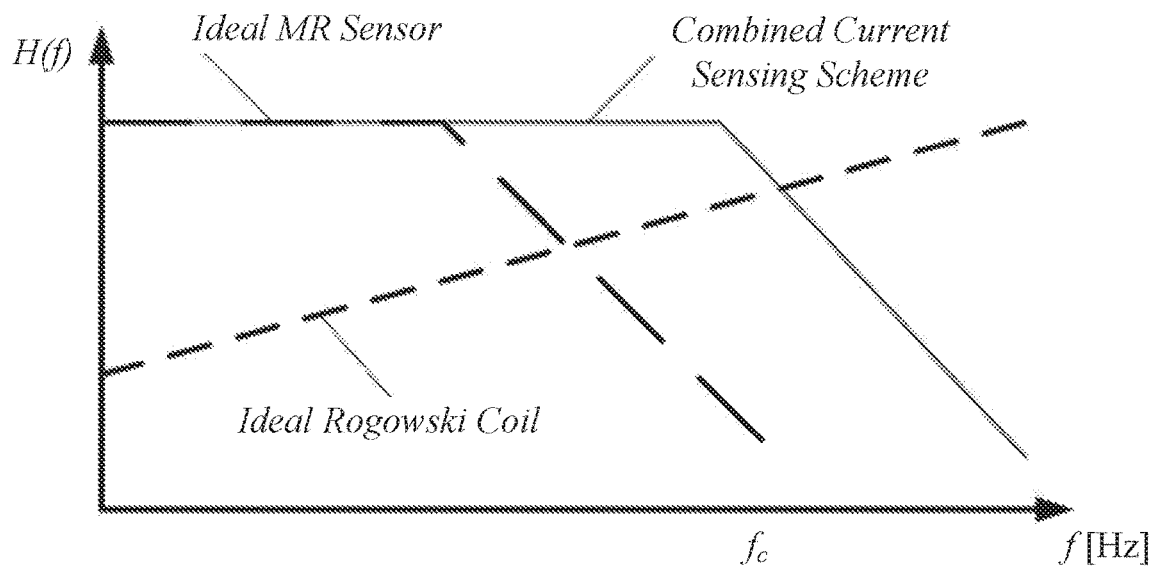
FIG. 1 is a plot illustrating the ideal characteristics of a magnetoresistor (MR), a Rogowski coil, and a hybrid current measurement scheme combining both, in accordance with various embodiments of the present disclosure.

Disclosed herein are various examples related to contactless wideband current sensing. Wideband and isolated current measurement is needed in many power electronics converters when the switching frequency is above 1 MHz. A hybrid current sensing scheme comprising a magnetoresistor-based sensor and planar Rogowski coil is presented. Modeling and experiments demonstrate that the proposed scheme yields a detection bandwidth of DC-10 MHz. Reference will now be made in detail to the description of the embodiments as illustrated in the drawings, wherein like reference numbers indicate like parts throughout the several views.

In power electronics circuits that contain high common-mode voltage, isolated current sensors are needed. Among many different types of sensors, Hall-effect sensors and magnetic field induction-based transducers are among the most popular technologies and their performance has improved over the years.

Typical Si-based Hall sensors have bandwidths that are limited to only tens of kiloHertz. Using materials with higher carrier mobility and lower bandgap than Si, such as GaAs and InAs, allows the sensing element's thickness to be reduced while increasing its sensitivity and ability to detect faster transients up to 1 MHz. Due to the emergence of high frequency (greater than 1 MHz) power converters and/or power converters with higher temperature operation capability using wide bandgap semiconductors, there is a need to develop alternative methods to detect the current at higher frequencies.

Magnetic field induction-based transducers such as current transformers (CT) and Rogowski coils use Faraday's law of induction and therefore is only applicable for AC current measurements. Unlike a CT, a Rogowski coil detects the derivative of the current (in the form of a voltage) due to a change in the magnetic fields seen by the coil. Integrating the voltage picked up at the secondary winding, which can be performed by an application specific integrated circuit (ASIC) or discrete op-amp integrator, gives the information of AC current. Implementation of a Rogowski scheme is in general less challenging than that for CTs and there is no saturation issue (with an air-core). Nonetheless, to have a wide frequency range of operation (especially the lower bound) using these current sensing techniques significantly increases the volume of the device. Because of this, they are mostly used as current probes.

Different types of magnetoresistors (MR) can be used in compassing and magnetometry applications for current measurements. While Hall-effect sensors are made of semiconductors, magnetoresistive sensors can be fabricated from both semiconductors and metal alloys. This permits the conductivity and the sensitivity to be tailored precisely to the application. In contrast to Hall-effect sensors, magnetoresistive sensors do not suffer from drift and are less susceptible to external noise, increasing their utility for applications in high frequency power electronics.

For wideband current measurement purposes, two complementary current sensing mechanisms can be merged such as, e.g., an anisotropic magnetoresistor (AMR) and a Rogowski coil. The ideal characteristics of the sensing elements and the combined current sensing scheme are illustrated in the plot of in FIG. 1. In the wideband current sensing scheme, the primary (or main) sensing element is the AMR in which it detects the current from DC to a certain frequency. As the frequency increases, the induced voltage in the secondary element (the Rogowski coil) due the current increases. These two responses can be conditioned and aggregated to obtain the combined current sensing scheme with a wideband characteristic as shown in FIG. 1. The following discloses various embodiments of wideband contactless current measurement over a bandwidth from DC to 10 MHz.

Figure 2A:
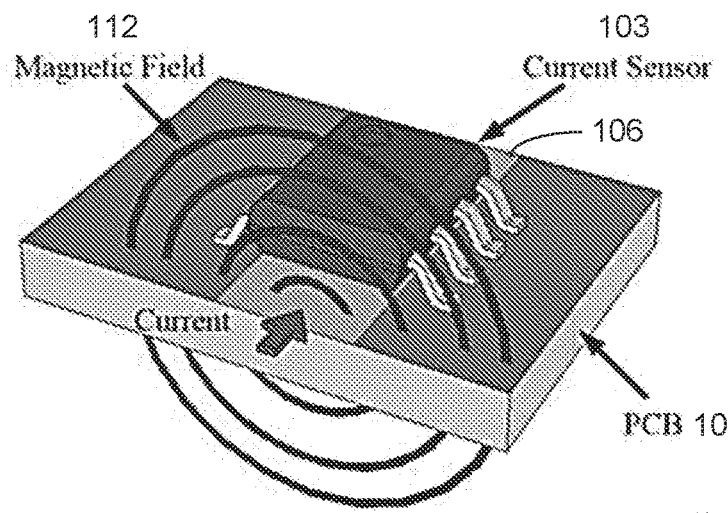
FIGS. 2A, 2B and 2C are graphical representations illustrating examples of a MR sensor and Rogowski coil with respect to a printed circuit board (PCB) trace, in accordance with various embodiments of the present disclosure.
Figure 2B:
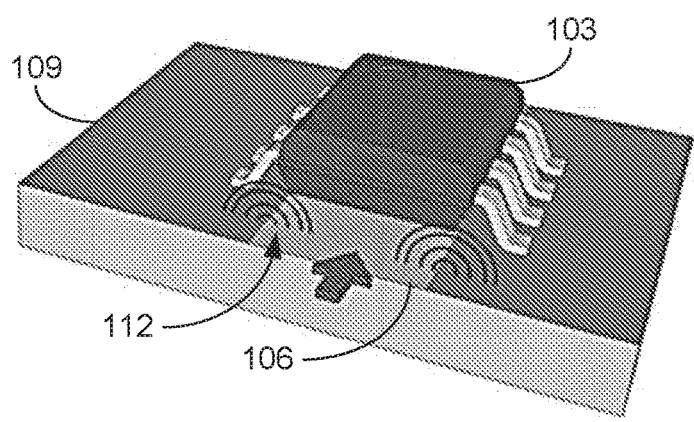
Figure 2C:
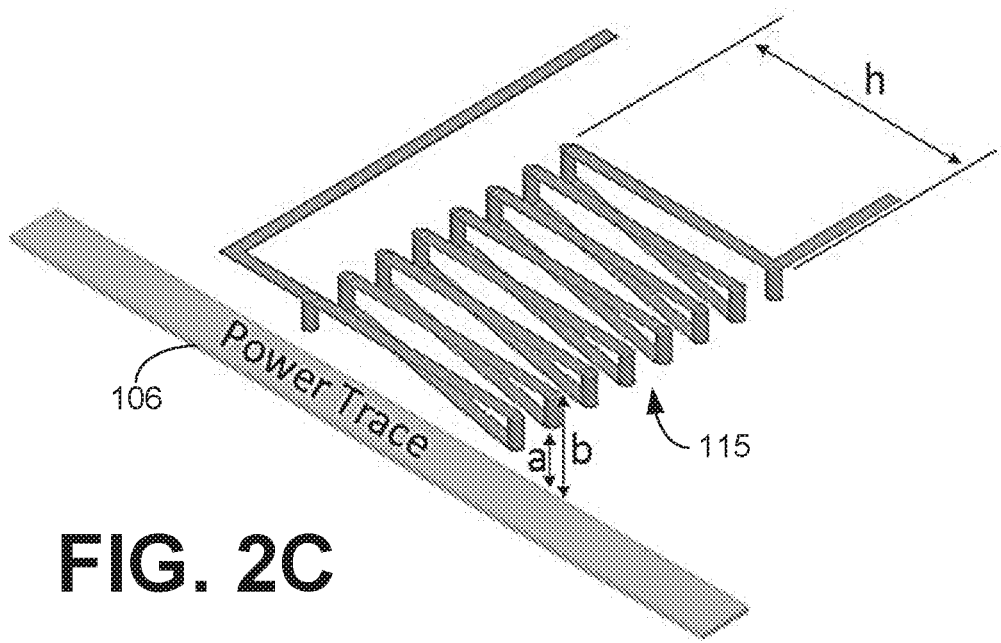

In a general case, an MR-based current sensor 103 can be positioned over or underneath a trace 106 on a printed circuit board (PCB) 109 without any conductive contact to the trace 106. MR sensors can include, but are not limited to, anisotropic magnetoresistance (AMR) sensor, giant magnetoresistance (GME) sensor, a tunnel magnetoresistance (TMR) sensor, etc. The relationship between the PCB trace 106 and MR sensor 103 is illustrated in FIGS. 2A and 2B. The MR sensor 103 detects the magnetic field 112 generated by the current carrying power through the PCB trace 106. At low frequencies, the magnetic field 112 is distributed uniformly around the PCB trace 106 as shown in FIG. 2A and it intersects the MR sensor 103 along the default axis generating a response. However, at higher frequencies, e.g. above 1 MHz, the current tends to flow mostly on the edges of the PCB trace 106 due to the skin effect. As a result, the generated magnetic field 112 distribution is not uniform and is mostly concentrated around the edges as shown in FIG. 2B. Unfortunately, the MR current sensor 103 detects the weaker part of magnetic field distribution at the frequency of operation, giving the false impression that it loses its sensitivity at higher frequencies. A Rogowski coil can be fabricated in the PCB 109 adjacent to the PCB trace 106 for current sensing. FIG. 2C illustrates an example of the layout of a Rogowski coil 115 with the coil axis aligned perpendicular to the PCB trace 106. The Rogowski coil 115 can also be integrated into an ASIC or an intelligent power module (e.g., as part of the power semiconductor switches or modules.

The magnetic field over the frequency range of interest can be normalized and/or enhanced with a magnetic concentrator (MCON) using conductive materials such as, e.g., a folded trace technique as described in PCT International Publication No. WO 2016/210287 ("Contactless Wideband Magneto-Resistive Current Sensor with Low Electromagnetic Interference"), which is hereby incorporated by reference in its entirety. An example of the folded trace technique is illustrated by the side and top views in FIG. 3A. The arrows indicate the direction of current flow. Folding the trace 103 over the MR sensor 103 concentrates the magnetic field seen by the sensor 103 and results in an increase in the detected bandwidth of the MR sensor 103 in the range from DC to a few MHz.

Figure 3A:
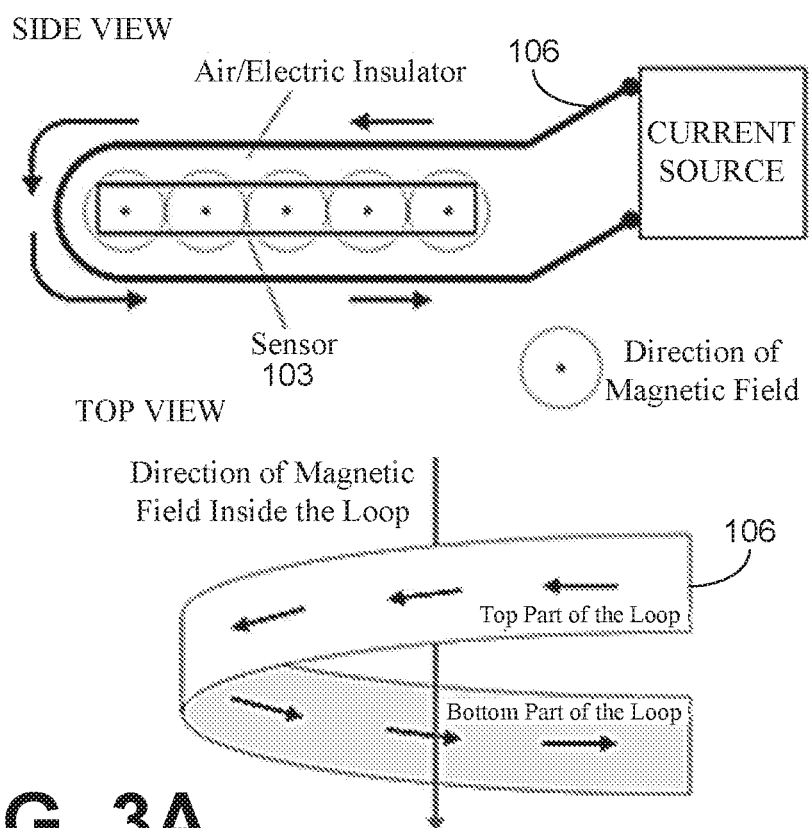
FIGS. 3A and 3B are graphical representations illustrating examples of magnetic concentrator (MCON) techniques that can be implemented to enhance sensing of the MR sensor and/or Rogowski coil, in accordance with various embodiments of the present disclosure.
Figure 3B:
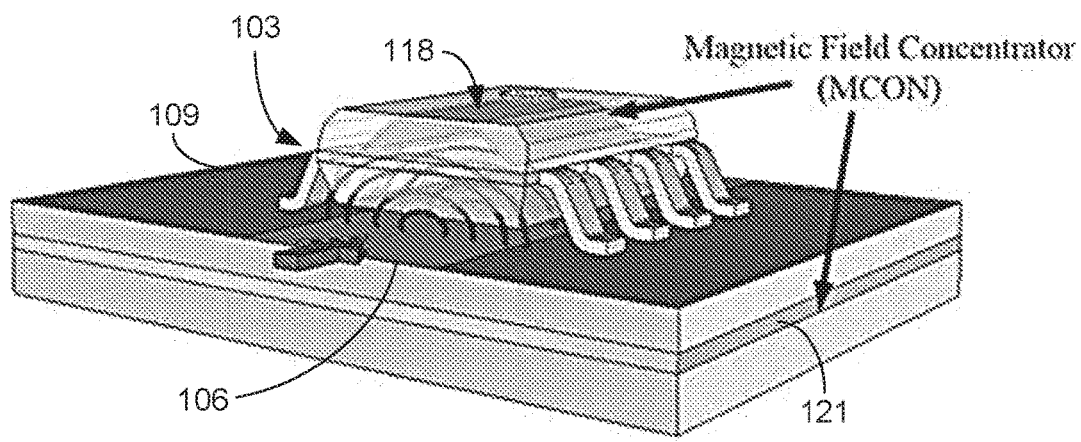

As shown in FIG. 3B, other MCONs can include a conductive shield that positioned over or under the MR sensor 103 and/or Rogowski coil 115. For example, a conductive shield 118 (e.g., a copper or aluminum sheet) can be placed over the MR sensor 103 and/or Rogowski coil 115 on the side opposite the PCB trace 106. The isolated conductive shield 115 eliminates the complexity of changing the current path while still maintaining good normalizing properties by concentrating the magnetic field produced by the current flowing through the PCB trace 106. While the conductive shield 118 can be placed over the MR sensor 103, in some implementations the conductive shield 118 can be integrated into the sensor chip as shown in FIG. 3B. A conductive shield 121 (e.g., a copper plate) can also be located below the PCB trace 106 opposite the MR sensor 103 and/or Rogowski coil 115, and in some cases can be integrated into the PCB 109 as shown in FIG. 3B. The combination of conductive shields 118 and 121 offers many of the same advantages of the folded trace configuration of FIG. 3A without needing to redirect the trace 106.

The wideband current sensing scheme is based on merging MCON-equipped MR current sensing (e.g., with an AMR sensor) with Rogowski coil sensing which, when combined, forms a wide bandwidth current sensing system. Having a primary MR sensor 103 that is able to measure DC to multi MHz currents along with a Rogowski coil 115 that detects very high frequency currents allows the size of the components and/or circuitry to be reduced. For example, the Rogowski pick-up coil 115 can be miniaturized by, for instance, using a PCB embedded coil. In addition to being contactless, wideband, and capable of DC current measurement, the combined current sensor does not include an integrator circuit for the Rogowski-based sensor 115. Hence, there is no need to continuously enable and reset the integrator at every switching cycle, which can be challenging for high frequency power converters.

Figure 4A:
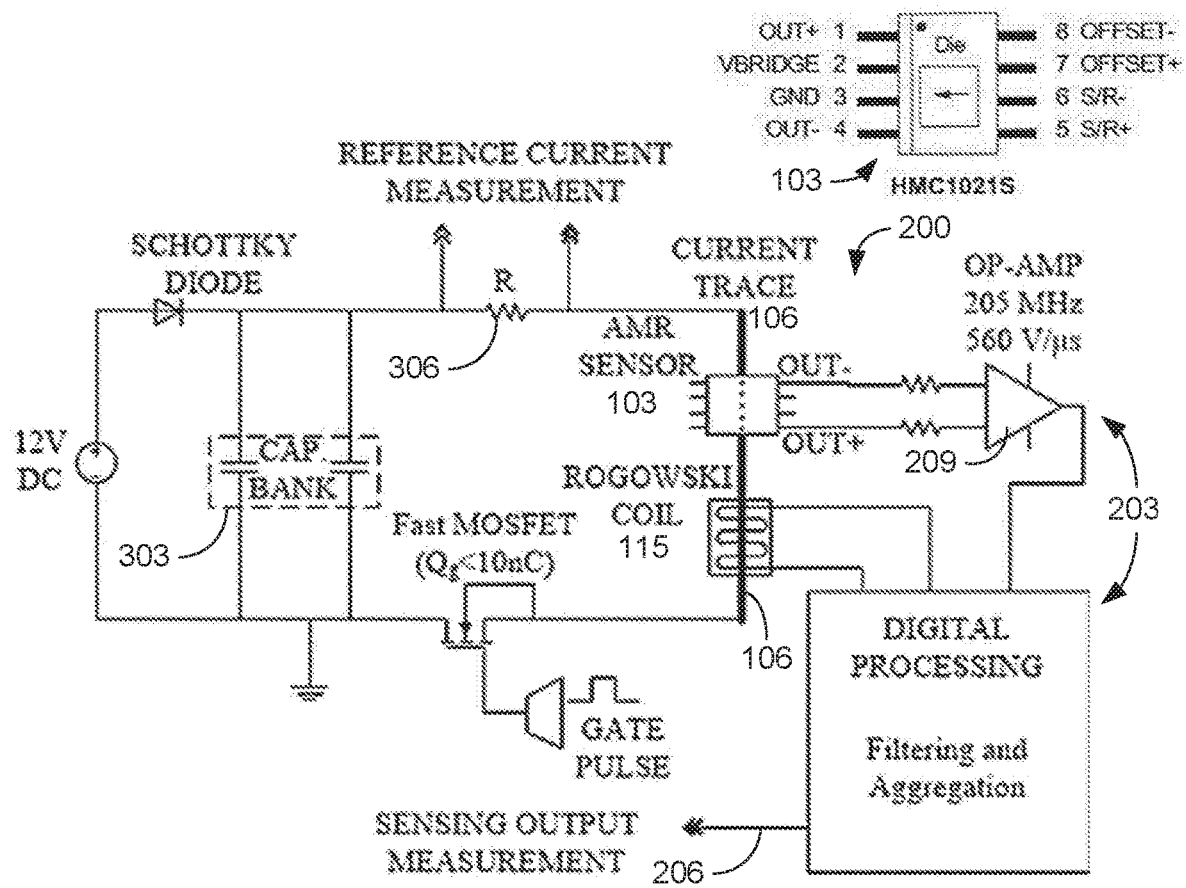
FIGS. 4A and 4B are schematic diagrams illustrating an example of a wideband magnetoresistive-Rogowski (MRR) current sensing system comprising an anisotropic magnetoresistor (AMR) sensor and a Rogowski coil, in accordance with various embodiments of the present disclosure.

Referring next to FIG. 4, shown in an example of a wideband magnetoresistive-Rogowski (MRR) current sensing system 200 comprising an AMR sensor 103 (e.g., an HMC1021S one-axis sensor) and a Rogowski coil 115. The MRR current sensing system 200 also includes processing circuitry 203 configured to provide a sensing output measurement 206 of the PCB trace current. The processing circuitry 203 can include digital processing, analog processing or a combination of both. For example, the processing circuitry 203 can include a processor and memory that can be configured to implement filtering and aggregation of the outputs of the AMR sensor 103 and Rogowski coil 115. The sensor outputs can be sampled using analog-to-digital converters (ADC) that can be integrated with other digital processing components in, e.g., a system on chip (SoC). The output of the AMR sensor 103 can be amplified (e.g., using an op-amp 209) before sampling. The processing circuitry 203 can also be configured to provide biasing, temperature compensation, hysteresis compensation or other processing functions.

Figure 4B:
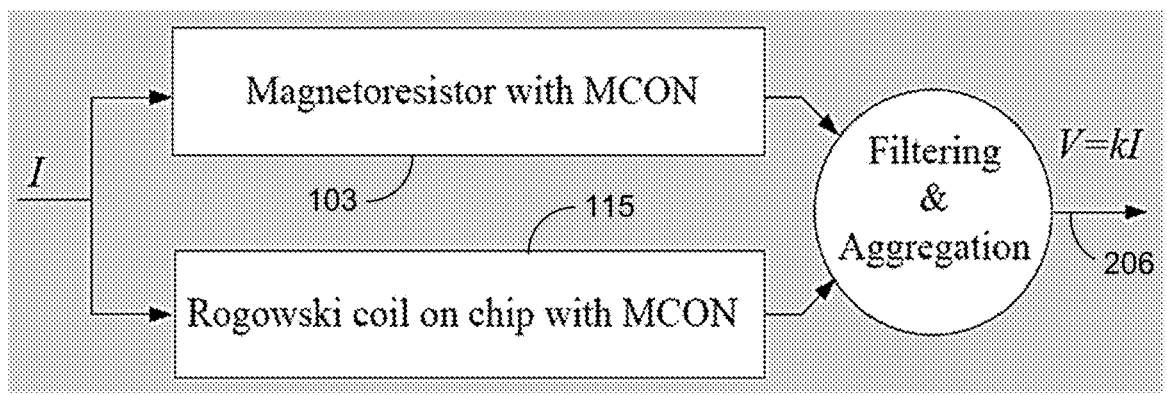

To examine the performance of the MMR current measurement scheme, several evaluation circuits were designed and implemented. FIG. 4 presents a circuit diagram of an example of a hardware setup designed to evaluate the performance of the MRR current sensing system 200. To evaluate the bandwidth of the current sensing, a fast high-rise current step function generator was developed. The step current was obtained by charging a capacitor bank 303 and then discharging it through a power resistor 306 (denoted by R) in 4. The voltage across the resistor 306 was taken as the reference current measurement. A rise time of 8 nsec was achieved for a 12 A current, allowing the bandwidth of the MRR sensing scheme to be evaluated up to 25 MHz. In the MRR current sensing system 200, a commercially available AMR sensor 103 (e.g., Honeywell HMC1021S one-axis sensor) was used as the primary sensing element, and a custom-designed PCB embedded Rogowski coil was used as the secondary sensor. In the example of FIG. 4, the output of the AMR sensor 103 was initially amplified by a differential amplifier 209 with a gain of 50 using high-speed operational amplifier (e.g., 205 MHz, 506 V/μs) such that it does not limit the frequency range of interest. The voltage obtained by this MR circuit along with the induced voltage in the embedded Rogowski coil 115 are provided to processing circuitry 203, which can be a digital signal-processing tool (e.g., Matlab software executed by a processor) configured to implement the filtering and aggregation to provide the sensing output measurement 206 as illustrated in FIG. 4B. Note that the signal processing circuitry 203 can be realized through either alternative digital or analogue circuits. In the implemented MRR current sensing system 200, the folded trace MCON technique illustrated in FIG. 3A was used to normalize and intensify the magnetic field for both the AMR and Rogowski coil sensing elements 103 and 115.

Figure 5A:
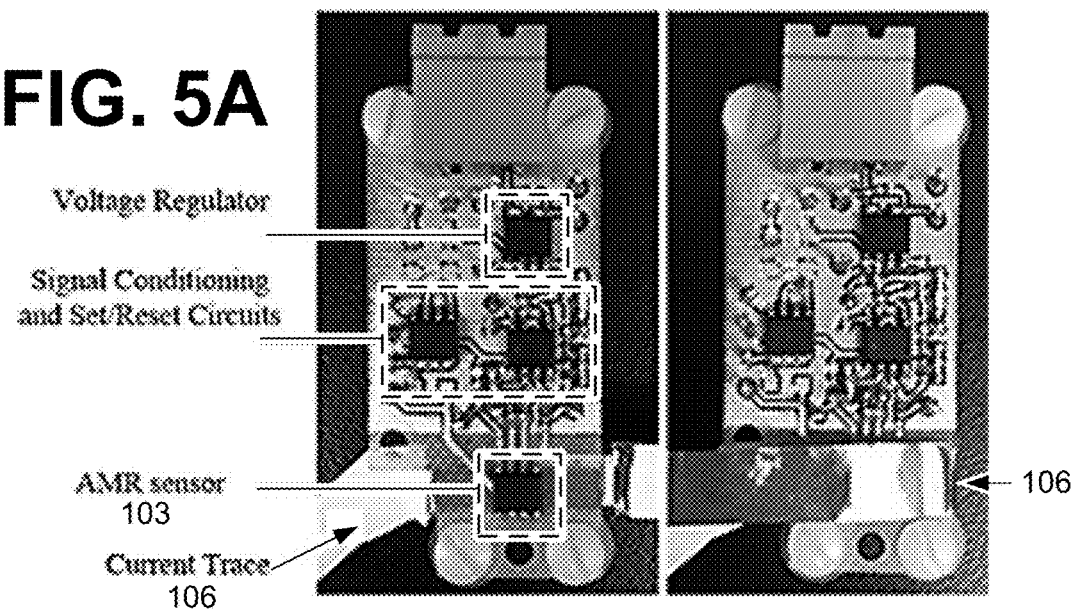
FIGS. 5A and 5B include images of hardware prototypes developed for the wideband MRR current sensing system of FIGS. 4A and 4B, in accordance with various embodiments of the present disclosure.
Figure 5B:
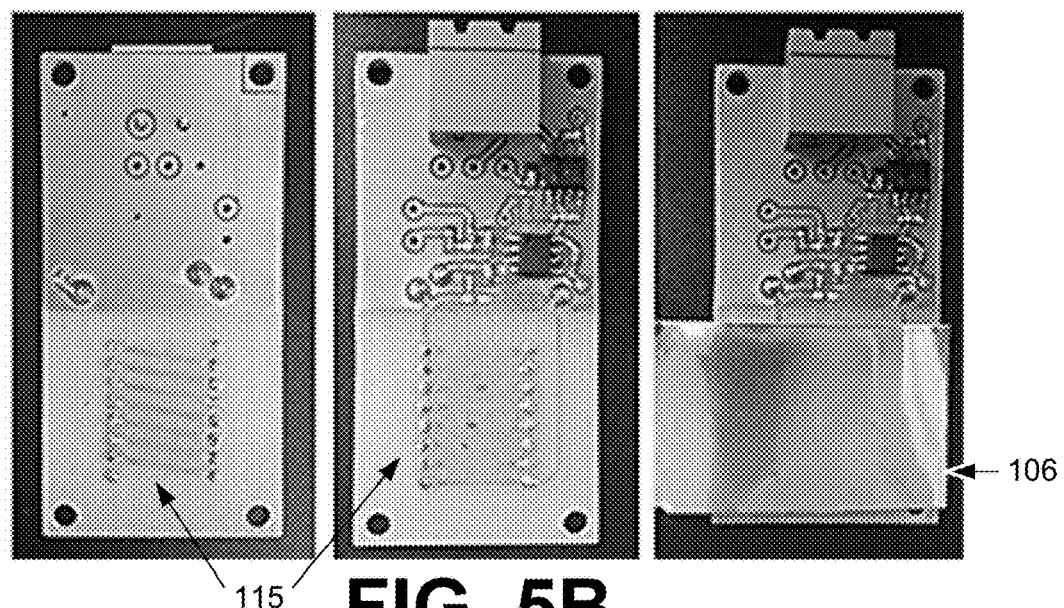

FIGS. 5A and 5B show examples of hardware prototypes developed for experimental testing of the wideband MRR current sensing system 200. The images of FIG. 5A show an AMR sensor board in a "standard" configuration (left image) with the AMR sensor 103 mounted over the PCB trace 106 and with the folded trace MCON implementation (right image) with the trace folded over the AMR sensor 103. The current carrying trace 106 (1 Oz copper) was implemented on the bottom layer of the PCB with a 1.5 mm thickness.

Copper foil (1 Oz) with a 35 µm thickness was used to implement the folded trace MCON covering the AMR sensor 103 as shown in the right image of FIG. 3A. The Rogowski coil 115 to complement the AMR detection range was developed on a two-layer PCB with coil traces having a 30 mil (0.76 mm) width. The coil traces on the top and bottom layers were connected through two rows of vias as shown in left and center images of FIG. 5B. The design of the embedded Rogowski coil 115 was adopted to facilitate a non-intrusive measurement with no integrator circuitries needed. The right image of FIG. 5B shows the folded trace MCOM over the Rogowski coil 115. The main current carrying trace 106 used the same copper foil (1 Oz) with a 35 µm thickness as for the sensor board, but wider to cover the coil with a one-sided insulator encompassing the embedded Rogowski coil 115. This approach takes advantage of the folded trace MCON technique that intensifies the fields, making it uniform in a wider frequency range, and enhancing the sensitivity of the sensing element.

Referring to FIG. 6 shows a block diagram illustrating the operating principal of the wideband MRR current sensing system 200. The AMR element 103 equipped with a folded trace MCON generates an output voltage that is proportional to the current sensed from DC to a cut-off frequency as shown in the lower AMR sensing signal path in FIG. 6. The frequency response of the AMR sensor 103 with and without the folded trace MCON was analyzed through experiments and showed that a fourth-order transfer function can represent the AMR sensor 103, which could be commented comfortably on the AMR bandwidth from DC to 3 MHz. A 10 MHz cut-off frequency was selected for the AMR conditioning (low pass filter) circuit 503 shown in FIG. 6.

Complementary to, and in parallel with, the lower AMR sensing path, an upper Rogowski coil sensing signal path is shown in FIG. 6. The Rogowski pick-up coil 115 provides an output which is (ideally) proportional to the derivative of the input current. However, in addition to mutual inductance, there exists self-inductance, inter-winding capacitance, and trace resistance. The Rogowski coil 115 can be modeled by a third-order system, which can be used for measuring the high frequency components of the current. The response from the Rogowski coil 115 with the folded trace MCON is filtered by a second-order bandpass filter 506 as shown in upper Rogowski coil signal path in FIG. 6. The corner frequencies of the bandpass filter 506 can be selected so that the output of the upper signal path rejects the low frequency components sensed by the AMR sensor 103 and also the resonance frequency of the Rogowski coil 115. After several iterations, the corner frequencies were selected to be 2 MHz and 20 MHz. Other frequency ranges can also be utilized.

To combine the responses of the AMR sensor 103 and the Rogowski coil 115, adjusting gains ($K_1$ and $K_3$) of the AMR and Rogowski coil filters 503 and 506 were set to achieve the desired response. A final low pass filter 509 tuned at a high frequency ensures that no noise is erroneously coupled to the sensing system output. The low pass filter can also limit the bandwidth of the output as needed. A summary of the system parameters determined for the prototype wideband MRR current sensing system 200 is tabulated in the table of FIG. 7. As one can expect, these parameters can vary with different wideband MRR current sensing system implementations. The prototype wideband MRR current sensing system 200 was designed to provide current measurements over a DC-10 MHz bandwidth.

Figure 8A:
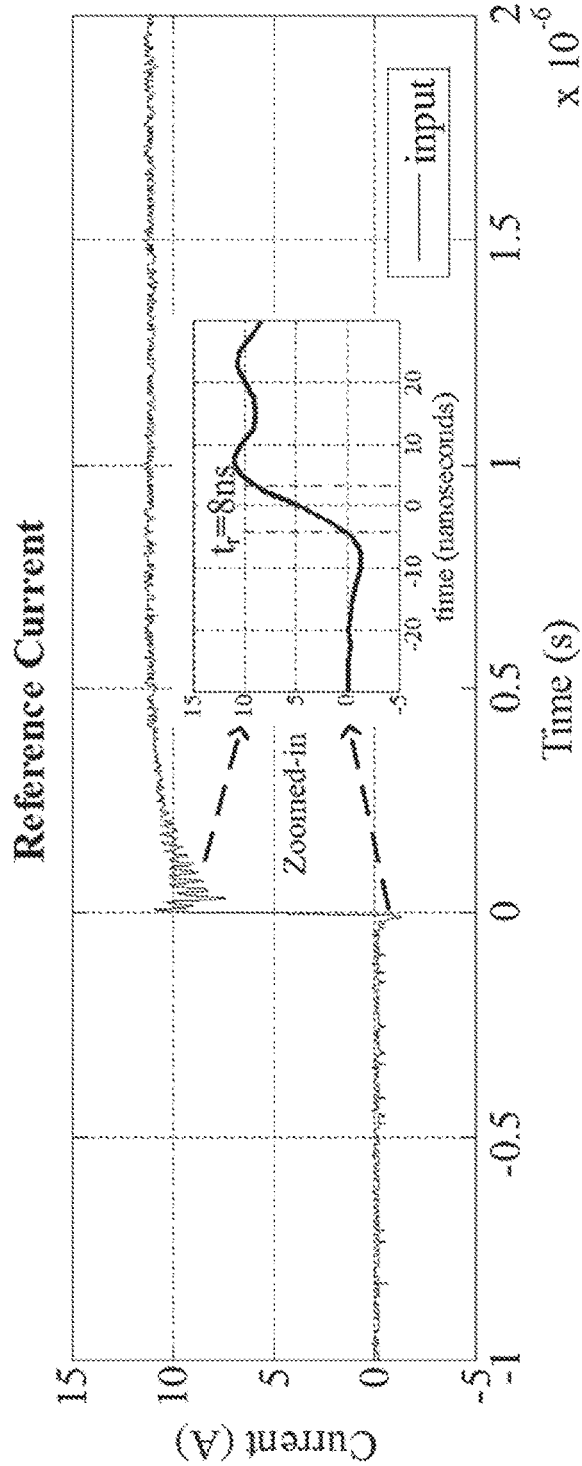
FIGS. 8A and 8B presents time domain plots illustrating the reference current and the AMR and Rogowski coil responses, in accordance with various embodiments of the present disclosure.
Figure 8B:
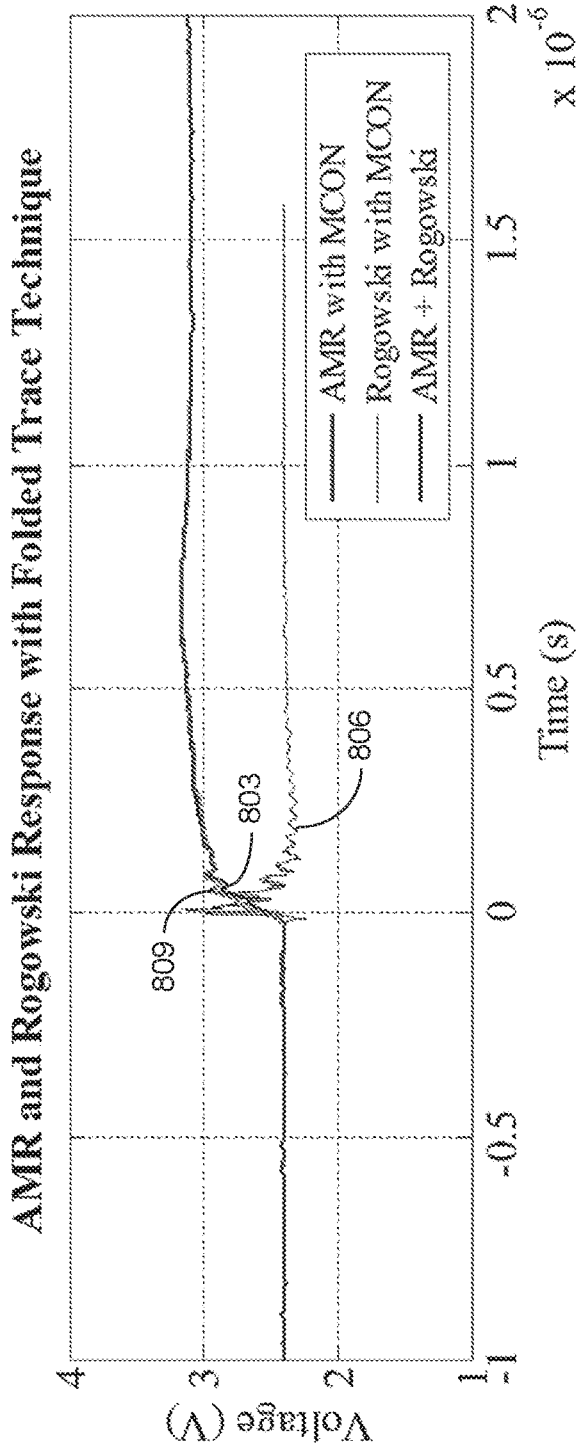

Referring next to FIGS. 8A and 8B, shown are examples of experimental results captured from prototype testing with the folded trace MCON technique. As shown in the reference current of FIG. 8A, a very fast rising current with less than a 10 ns rise time for 12 A was achieved, which allows the MRR current sensing scheme to be comfortably characterized up to 25 MHz. FIG. 8B shows the folded trace MCON-equipped AMR and Rogowski coil responses. The data collected from the prototype testing revealed that while the AMR sensor 103 followed the reference current from DC to certain transient levels (curve 803), the Rogowski coil 115 only detected the fast AC transients. The response (curve 806) of the Rogowski coil 115 after the bandpass filter (506 of FIG. 6) without applying the adjusting gain $K_1$, is shown in FIG. 8B. Applying the gains shown in the table of FIG. 7, aggregation of filtered AMR and Rogowski coil outputs, and final low-pass filtering (509 of FIG. 6) tuned at 10 MHz results in a response (curve 809) presented in FIG. 8B. As can be seen, the aggregated result can follow the reference current of FIG. 8A more precisely than the one with only folded trace MCON-equipped AMR sensor 103 (curve 803).

To have a closer look at the obtained time-domain results, FIGS. 9A and 9B presents the frequency response analysis of the normalized experimental data shown in FIG. 8B. FIG. 9A shows the magnitude response and FIG. 9B shows the phase response for the AMR sensor 103 in a "standard" configuration without MCON (curves 903), the AMR sensor 103 with folded trace MCON (curves 906), and the MRR current sensing combining AMR and Rogowski coil sensing with folded trace MCON (curves 909). The frequency response for the AMR sensor in "standard" configuration without folded trace technique (curves 903) is included to illustrate the effect of the folded trace MCON. The difference in detection bandwidth for the AMR sensor 103 is clearly visible in the magnitude and phase response plots. Looking at both magnitude and phase response of the MCON-equipped AMR sensor 103 (curves 906), it clearly shows an extended bandwidth of DC-3 MHz. Once the conditioned responses from the AMR sensor 103 and Rogowski coil 115 are aggregated (curves 909), it can be seen that the frequency bandwidth is further extended from DC to 10 MHz.

Figure 10A:
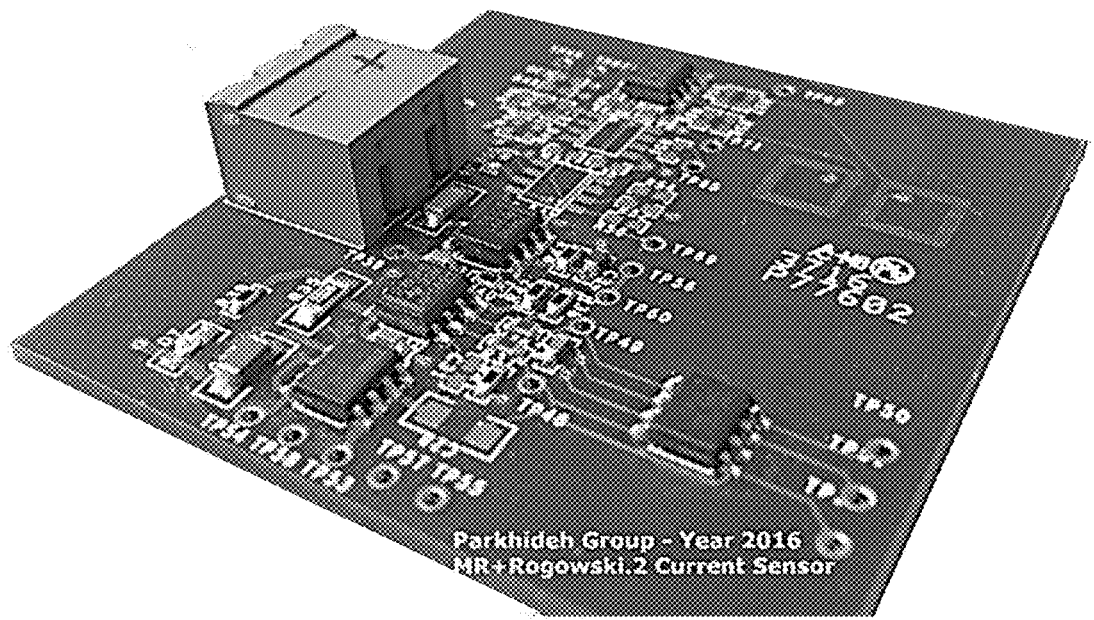
FIG. 10A is an image showing an example of a wideband MRR current sensing system with common-mode noise rejection, in accordance with various embodiments of the present disclosure.
Figure 10B:
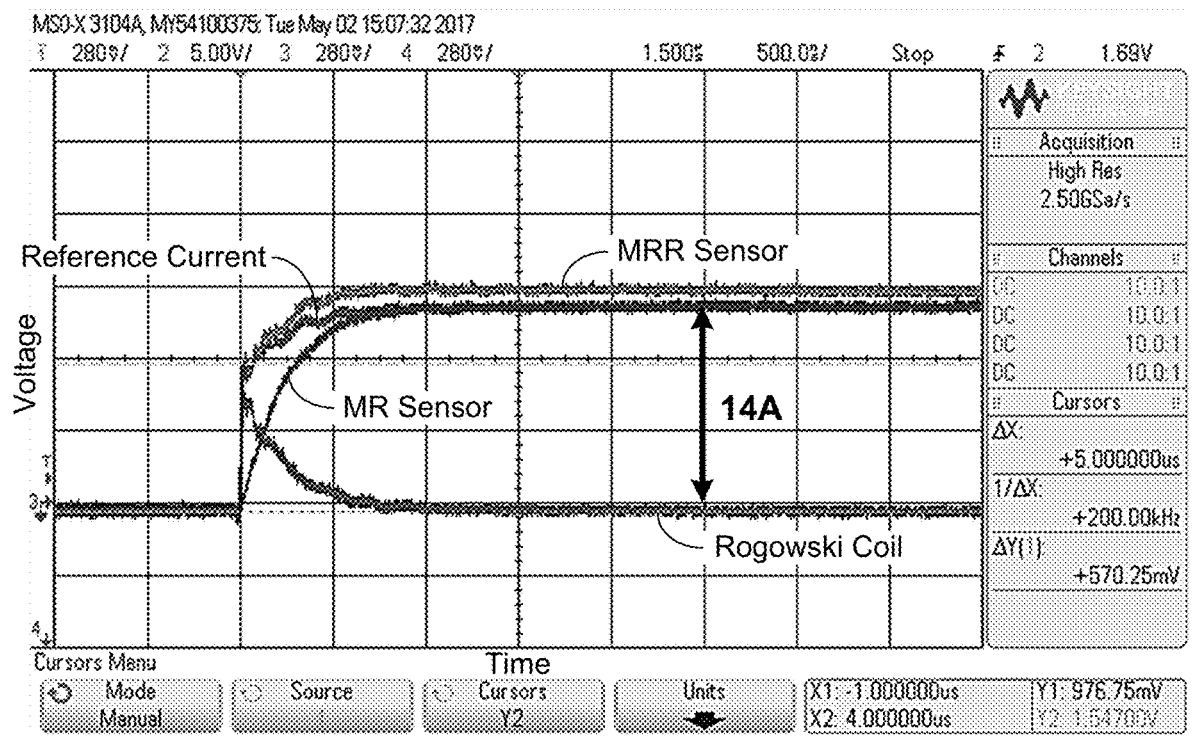
FIGS. 10B and 10C present experimental results showing the reference current and wideband MRR current sensing system output of the MRR current sensing system of FIG. 10A, in accordance with various embodiments of the present disclosure.
Figure 10C:
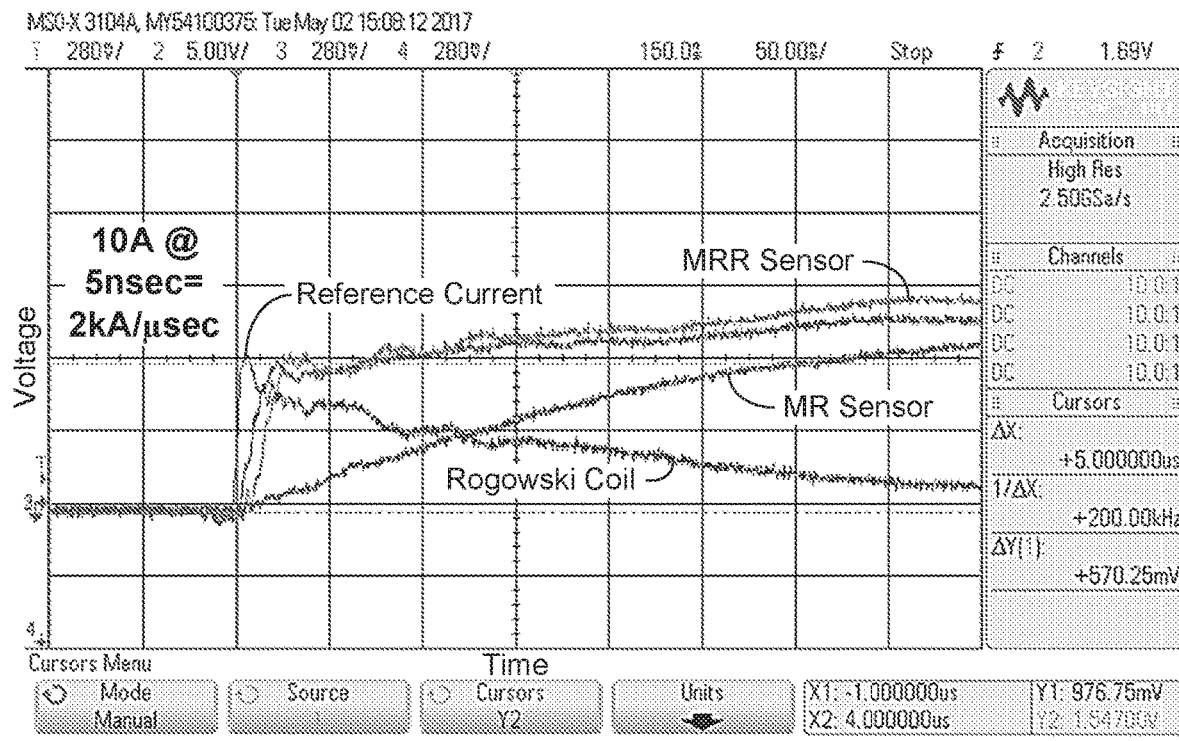

Another embodiment of the wideband MRR current sensing system 200 was implemented with common-mode noise rejection. FIG. 10A is an image of an implemented MRR current sensing system 100 with common-mode noise rejection that was tested. The test results for the reference current of 10 Amps and the sensing output measurement 206 are shown in the screen shot of FIG. 10B. The current output exhibits good correlation with the actual current, and shows that a bandwidth from DC to more than 10 MHz can be achieved. FIG. 10C provides an enlarged view of the transient in FIG. 10B, which emphasizes the tracking of the MRR current sensing with the reference current.

Figure 11A:
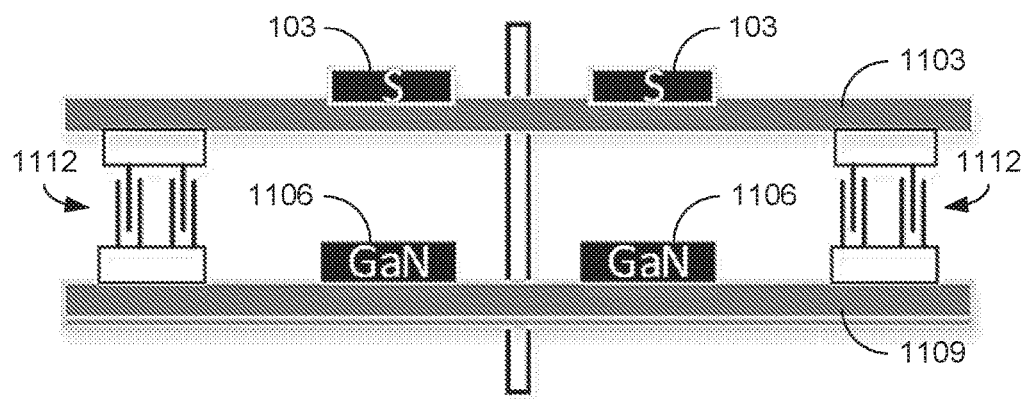
FIGS. 11A-11C illustrate an example of a wideband MRR current sensing system implemented over power semiconductor switches, in accordance with various embodiments of the present disclosure.
Figure 11B:
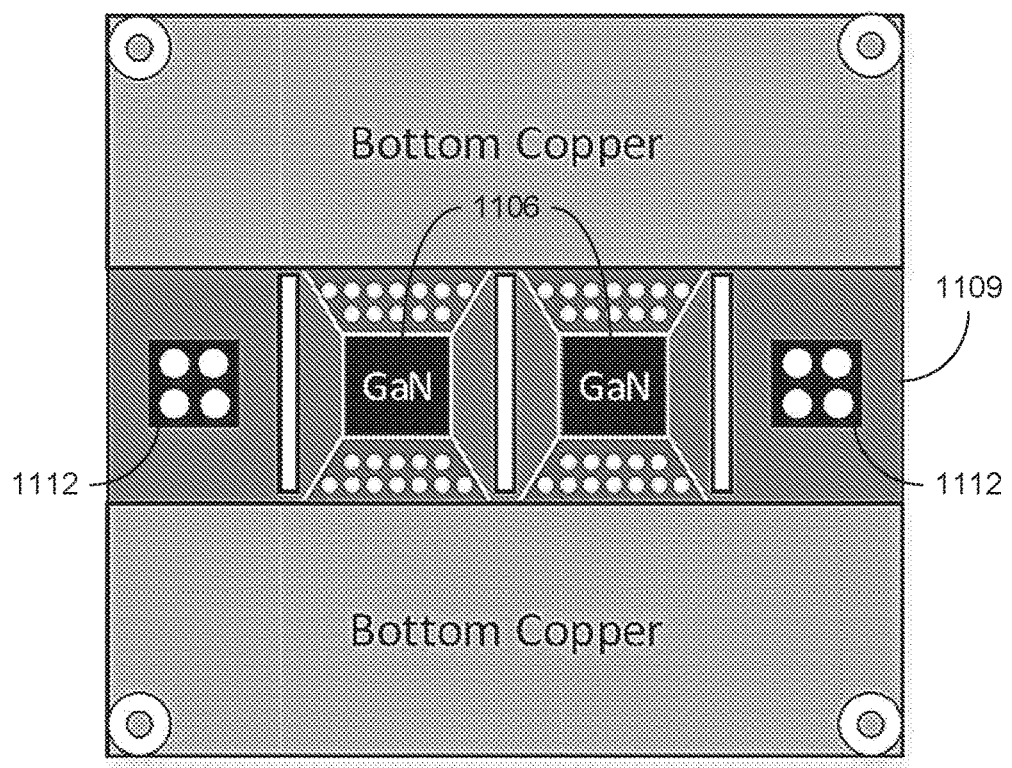
Figure 11C:
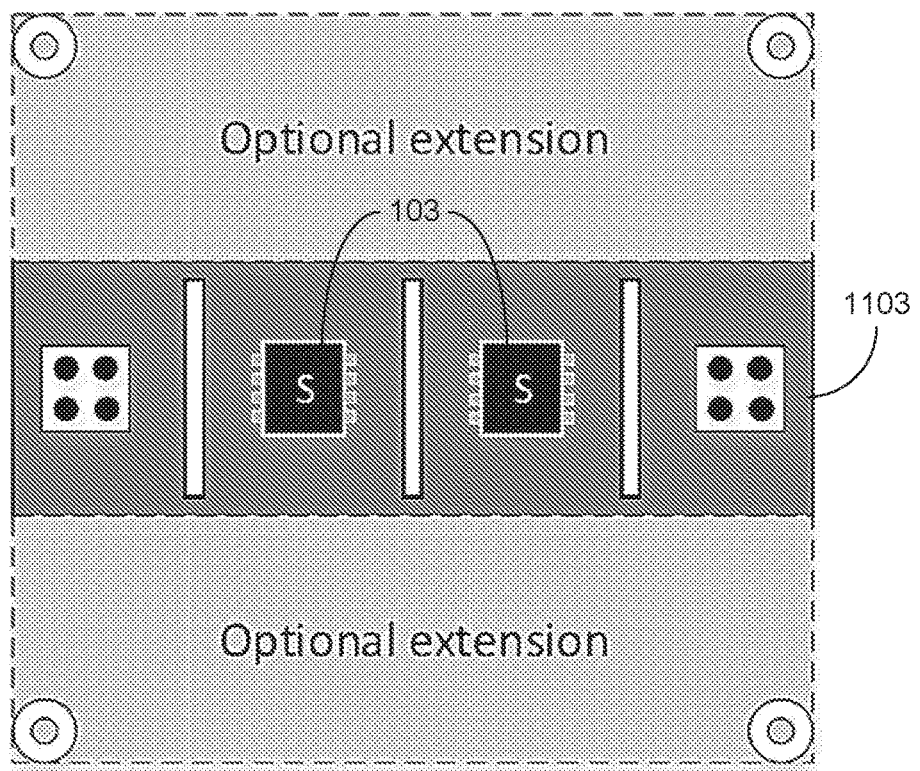

Referring next to FIGS. 11A-11C, shown is an example of the wideband MRR current sensing system 200 implemented over power semiconductor switches (e.g., GaN switches) 1103. FIG. 11A is a side view that schematically illustrates MR sensors 103 on a sensing board 1103 positioned over the power semiconductor switches 1106 on a power board 1109. FIG. 11B is a top view of the parallel switch power board 1109 with two GaN switches 1106. The sensor board 1103 supports the MR sensors 103 over the power semiconductor switches 1106. FIG. 11C is a top view of the sensing board 1103. In other implementations, the MR sensors 103 can be positioned below the power semiconductor switches 1106. Rogowski coils 115 (FIG. 2C) can be integrated into the sensor board 1103, or can be located on the parallel switch power board 1109 next to the power semiconductor switches 1106. Sockets 1112 or other connectors can affix the sensing board 1103 to the power board 1109, and can provide connections between sensors on the boards 1103 and 1109.

This disclosure details a contactless wideband current measurement scheme operating based on two complementary characteristics. The primary sensing element was the AMR sensor 103, and applying the folded trace MCON resulted in a normal field seen by the AMR sensor 103 over a wide frequency range and hence an enhanced detection bandwidth. The secondary sensing element was a Rogowski coil 115 whose response was tailored to complement the AMR response. Having a primary sensor with a bandwidth from DC to multiple MHz allows the size of the Rogowski pick-up coil 115 to be reduced and embedded into a PCB. It was verified through lab experiments that the combined AMR-Rogowski (or MRR) current sensing scheme to have a bandwidth from DC to 10 MHz (or more). The MRR current sensing method can be applied in high frequency power converters in which the inductor current is used for control purposes.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A wideband contactless current sensing system, comprising:
a magnetoresistive (MR) sensor disposed adjacent to a trace configured to carry current, where the MR sensor is configured to provide an MR output voltage corresponding to a magnitude of the current at frequencies from DC to at least a MHz cutoff frequency;
a Rogowski coil sensor comprising a Rogowski coil disposed adjacent to the trace, where the trace does not surround the Rogowski coil, the Rogowski coil sensor configured to provide a Rogowski output voltage corresponding to the magnitude of the current at frequencies from at least the MHz cutoff frequency to at least 10 MHz; and
processing circuitry configured to generate an output current signal by aggregating the MR and Rogowski output voltages, the output current signal corresponding to the magnitude of the current passing through the trace at a frequency in a range from DC to at least 10 MHz.

2. The wideband contactless current sensing system of claim 1, wherein the processing circuitry is configured to condition the MR output and the Rogowski output prior to aggregating.

3. The wideband contactless current sensing system of claim 2, wherein conditioning of the MR output comprises low pass filtering prior to aggregation with the Rogowski output.

4. The wideband contactless current sensing system of claim 2, wherein conditioning of the Rogowski output comprises bandpass filtering prior to aggregation with the MR output.

5. The wideband contactless current sensing system of claim 4, wherein the bandpass filtering has a range from about 2 MHz to about 20 MHz.

6. The wideband contactless current sensing system of claim 1, wherein the output current signal is low pass filtered by the processing circuitry after aggregation of the MR and Rogowski outputs.

7. The wideband contactless current sensing system of claim 1, wherein the processing circuitry comprises digital processing circuitry including analog-to-digital converters (ADCs) configured to sample the MR and Rogowski outputs.

8. The wideband contactless current sensing system of claim 7, wherein the processing circuitry comprises an amplifier coupled between an output connection of the MR sensor and the ADC configured to sample the MR output.

9. The wideband contactless current sensing system of claim 1, wherein the Rogowski coil is a linear coil embedded in a printed circuit board (PCB) adjacent to the trace with a coil axis of the Rogowski coil aligned substantially perpendicular to the trace.

10. The wideband contactless current sensing system of claim 9, wherein a magnetic field produced by the current carried by the trace is concentrated by a magnetic concentrator (MCON) disposed over the Rogowski coil.

11. The wideband contactless current sensing system of claim 1, wherein the trace is disposed on a surface of a printed circuit board (PCB), and the MR sensor is an anisotropic magnetoresistor (AMR) sensor mounted on the surface of the PCB over the trace with a magnetic concentrator (MCON) disposed over the AMR sensor opposite the trace.

12. A method for wideband contactless current sensing, comprising:
generating a first conditioned signal by conditioning an output from a magnetoresistive (MR) sensor disposed adjacent to a trace carrying a current, the output from the MR sensor corresponding to a magnitude of the current;
generating a second conditioned signal by conditioning an output from a Rogowski coil disposed adjacent to the trace, where the trace is not surrounded by the Rogowski coil, the output from the Rogowski coil corresponding to the magnitude of the current; and
aggregating the first and second conditioned signals to provide an output current signal corresponding to the current passing through the trace, where the output current signal corresponding to a fixed current magnitude is substantially constant over a frequency range from DC to at least 10 MHz.

13. The method of claim 12, wherein the first conditioned signal is generated by low pass filtering the output from the MR sensor.

14. The method of claim 12, comprising amplifying the output from the MR sensor prior to conditioning.

15. The method of claim 14, wherein the output from the MR sensor is amplified by a differential operational amplifier.

16. The method of claim 12, wherein the second conditioned signal is generated by bandpass filtering the output from the Rogowski coil.

17. The method of claim 16, wherein the bandpass filter is a second order bandpass filter.

18. The method of claim 12, wherein the output of the MR sensor is adjusted by a first gain factor and the output of the Rogowski coil is adjusted by a second gain factor.

19. The method of claim 12, wherein a magnetic field produced by the current carried by the trace is concentrated by a magnetic concentrator (MOON) disposed over the Rogowski coil.

20. The method of claim 12, wherein the trace is disposed on a surface of a printed circuit board (PCB), and the MR sensor is an anisotropic magnetoresistor (AMR) sensor mounted on the surface of the PCB over the trance and having a magnetic concentrator (MOON) positioned over the AMR sensor opposite the trace.

* * * * *